(12) United States Patent
Sachdev

(10) Patent No.: US 6,445,235 B1
(45) Date of Patent: Sep. 3, 2002

(54) $I_{DDQ}$-TESTABLE UNI-DIRECTIONAL MASTER-SLAVE

(75) Inventor: Manoj Sachdev, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 1131 days.

(21) Appl. No.: 08/498,549

(22) Filed: Jul. 5, 1995

(30) Foreign Application Priority Data

Jul. 5, 1994 (EP) ............................................. 94201929
Jan. 30, 1995 (EP) ............................................. 95200212

(51) Int. Cl.[7] ............................................. H03K 3/356
(52) U.S. Cl. ............................................. 327/202; 327/203
(58) Field of Search ............................................. 327/199–203, 327/208, 209, 210, 211, 212, 218; 714/726, 731

(56) References Cited

U.S. PATENT DOCUMENTS

| 4,794,276 | A | * | 12/1988 | Sasada et al. | 327/202 |
| 5,107,137 | A | * | 4/1992 | Kinugasa | 327/203 |
| 5,189,315 | A | | 2/1993 | Akata | 307/272.2 |

FOREIGN PATENT DOCUMENTS

| DE | 3443788 | * | 6/1986 | 327/203 |
| EP | 633530 | | 1/1995 | G06F/11/22 |
| JP | 189810 | * | 4/1989 | 327/203 |
| JP | 3201717 | * | 9/1991 | 327/199 |
| JP | 4167612 | * | 6/1992 | 327/199 |
| JP | 4246908 | * | 9/1992 | 327/202 |

OTHER PUBLICATIONS

"Mestastability Behavior of CMOS ASIC Flip—Flop in Theory and Test", by Jens U. Hortsmann, et al, IEEE Journal of Solid–State Circtuis, vol. 24, No. 1, Feb. 1989, pp. 146–157.

"Current vs. Logic Testability of Bridges in Scan Chains", by R. Rodriquez–Montanes, et al, of Proc. European Test Conf. 1993, pp. 392–396.

* cited by examiner

Primary Examiner—Tuan T. Lam
(74) Attorney, Agent, or Firm—Aaron Waxler

(57) ABSTRACT

A flipflop has master and slave interconnected through a buffer. The master has its inverters located outside the signal path from input to output, as the buffer provides the driving capability required for both $I_{DDQ}$-testing and operational use. This configuration enables $I_{DDQ}$-testing without further circuitry added to the flipflop and reduces propagation delay in the signal path.

10 Claims, 2 Drawing Sheets

$I_{DDQ}$-TESTABLE UNI-DIRECTIONAL MASTER-SLAVE

BACKGROUND OF THE INVENTION

This invention relates to a method of testing an electronic circuit that has at least one flipflop with a master and a slave interconnected via a controllable coupling, wherein the method comprises quiescent current testing of the flipflop. The invention further relates to a circuit with such a flipflop.

A static flipflop is an important building block in the design of digital CMOS integrated circuits. A typical digital CMOS integrated circuit may contain several thousands of flipflops. A typical master-slave flipflop comprises a master latch and a slave latch interconnected through a transmission gate. Each respective one of the latches includes a respective further transmission gate to enable writing data and latching the data. In operational use of the flipflop the master and slave are alternately enabled to accept or store data by complementary control of the transmission gates, so as to functionally disconnect the flipflop's input from its output.

Static flipflops such as those fabricated in CMOS, all share the same problem i.e. that particular bridging defects causing stuck-at faults cannot be detected through quiescent current measurements, also referred to as $I_{DDQ}$-testing, without special provisions. Bridging defects are considered the single most important manufacturing defect mechanism responsible for yield loss. Special Design-for-Testability measures are required in order to enable detection of such defects in flipflops under $I_{DDQ}$-testing. $I_{DDQ}$-testing is recognized as the quality-improving complement to Boolean testing and among experts the opinion prevails that the quality achieved through $I_{DDQ}$ test techniques is not matched by any other test method.

European patent application 0 633 530 corresponding to U.S. application Ser. No. 08/271,801, incorporated herein by reference in its entirety. Teaches converting a sequential logic circuit into a combinatorial logic circuit. This conversion enables testing flipflop circuitry and scan chain circuitry using $I_{DDQ}$ test techniques in order to detect bridging defects and open defects. The flipflop's capability of being reversibly convertible into a combinatorial logic circuit significantly reduces test complexity and substantially improves fault coverage. Basically, conversion to a combinatorial circuit renders the flipflop transparent. A logical conflict created across a defect is sustained by the data input of the flipflop. Making entire flipflop chains transparent drastically reduces test complexity.

In the test method discussed in aforesaid European patent application 0 633 530, master and slave are enabled simultaneously to render the logic combinatorial and, therefore, suitable for $I_{DDQ}$-testing. Additional circuitry is required to enable this conversion to the transparent state. For example, the additional circuit provides independent control of the clock signal and its logic complement. This configuration requires dual clock lines to each flipflop, and therefore raises cost and affects timing criticality of the design as a proper timing relationship between the clock signal and its complement must be ensured throughout the entire circuit. Reference is made to the above European patent application 0 633 530 for further details and alternative ways to implement means for reversibly changing a sequential circuit to a combinatorial circuit.

SUMMARY OF THE INVENTION

It is, inter alia, an object of the invention to further reduce test complexity and cost. It is a further object to enable $I_{DDQ}$-testing of flipflops while using less additional circuitry.

To this end, the invention provides a method of testing as specified in the preamble and characterized in that the method comprises applying the quiescent current testing to the flipflop whose controllable coupling is unidirectional, and in that the quiescent current testing comprises determining a quiescent current after clock-controlled data transfer from the master to the slave.

Specific low-resistive bridging defects in a master-slave flipflop cannot be detected by $I_{DDQ}$-testing save by rendering the flipflop transparent according to the method cited in European patent application 0 633 530. This method, however, requires additional circuitry to effect the transparency. The invention is, among other things, based on the insight that rendering the flipflop or chains of flipflops transparent is not necessary if the coupling between master and slave is unidirectional.

The controllable coupling is conventionally implemented by a transmission gate. Such a bi-directional path between the master and slave, however, enables overwriting of the master, e.g., by a bridging defect in the slave, during data transfer from master to slave. The overwriting occurs as a consequence of a voltage conflict during this transitory phase and will go undetected in a quiescent state. The inventor has found that, if the controllable coupling between the master and slave is unidirectional at least during testing, the voltage conflict will persist without affecting the data of the master and will therefore be detectable by $I_{DDQ}$-testing.

A flipflop having master and slave coupled through a buffer circuit is known from U.S. Pat. No. 5,189,315 issued to Akata. The buffer circuit blocks the master from undesirable influence of the slave and renders the flipflop suitable for higher clock rates than is achievable in un-buffered flipflops. This prior art reference, however, does not address the testability of such circuit, let alone the use of $I_{DDQ}$-techniques. The present invention recognizes the fact that a flipflop with a unidirectional coupling between master and slave is highly suitable for being tested using a quiescent current method.

The unidirectional coupling may comprise a buffer circuit in series with a bi-directional switch. For example, the buffer circuit is a conventional CMOS-type inverter and the switch is a conventional transmission gate. Alternatively, the unidirectional coupling comprises a buffer with a first input connected to the master, an output connected to the slave and a control input for enabling the buffer. Proper enabling and disabling has the same function as controlling the transmission gate. A switched inverter can be used as such a buffer.

For the sake of completeness, reference is made to "Metastability Behavior of CMOS ASIC Flip-Flops in Theory and Test", J. U. Horstmann et al., IEEE Journal of Solid Sate Circuits, Vol. 24, No. 1, February 1989, pp. 146–157, notably FIG. 13(b). This reference shows switched inverters used throughout a master-slave flipflop instead of the usual transmission gates in order to reduce metastability. A switched inverter is a conventional CMOS inverter connected between its supply terminals via complementarily clock-controlled transistors. Not only the coupling between the master and slave, but also the switches in the master and slave are comprised of such a switched inverter. In the invention, however, preferably only the coupling between the master and slave is unidirectional, the master and slave comprising a bi-directional switch each. Due to the switched inverters, the prior art design needs a greater number of additional transistors and clock control taps than does the circuit specified in the invention. Again, this prior art document does not address the issue of testability.

As demonstrated above, the inventor has recognized that the driving capability of the buffer in the unidirectional coupling plays a major role in the operation of the flipflop. The driving capability both sustains the quiescent current in case of a voltage conflict caused by a $I_{DDQ}$-detectable defect, and enables overwriting the slave during normal operational use. Accordingly, the inventor has recognized that it is not the driving capability of the master which is relevant to testing and operational use, but the driving capability of the buffer. Therefore, the master's inverters are better kept out of the signal path that runs between input and output of the flipflop, in order to reduce propagation delay in a flipflop with unidirectional coupling. In the flipflop of Akata referred to above, the signal path includes a master inverter, thus inflicting an extra, unnecessary propagation delay. According to the invention, the master comprises first and second inverters, the first inverter having an input connected to the unidirectional coupling and having an output connected to an input of the second inverter.

BRIEF DESCRIPTION OF THE DRAWING

The invention will be explained in further detail and by way of example with reference to the accompanying drawing, wherein.

Throughout the drawing, like reference symbols indicate similar or corresponding features.

DETAILED DESCRIPTION OF THE PREFERRED EMBODIMENT

Figure 1:
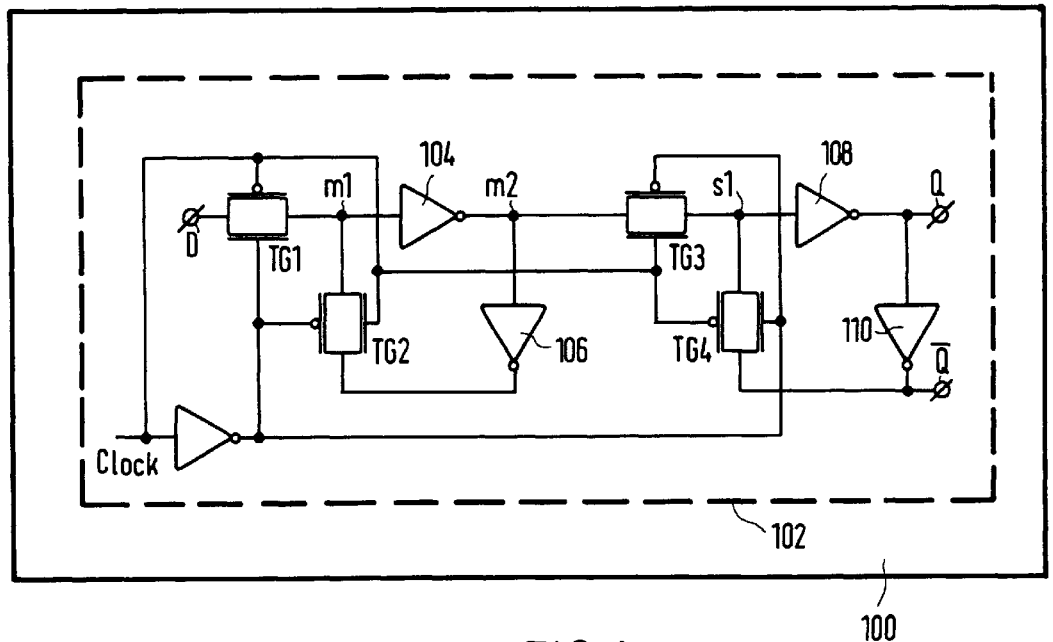
FIG. 1 is a diagram of a typical prior art flipflop.

FIG. 1 is a diagram of an electronic circuit 100 with a typical flipflop 102. Flipflop 102 is a single-phase clock master-slave flipflop. Flipflop 102 includes a transmission gate TG1 connected to input D, a master comprised of inverters 104 and 106 and of a transmission gate TG2, a transmission gate TG3, and a slave comprised of inverters 108 and 110 and of a transmission gate TG4. Transmission gates TG1 to TG4 are clock controlled.

When the clock signal is low, transmission gates TG1 and TG4 are conducting and transmission gates TG2 and TG3 are blocked, and when the clock signal is high, transmission gates TG2 and TG3 are conducting and transmission gates TG1 and TG4 are blocked. When the clock is low, master 104/106/TG2 accepts data from input D while slave 108/110/TG4 retains its data accepted previously. When the clock signal goes high, master 104/106/TG2 no longer accepts data from input D, and slave 108/110/TG4 is rendered susceptible to new data supplied by master 104/106/TG2. In a defect-free flipflop, slave 108/110/TG4 assumes a state in conformity with the data received from master 104/106/TG2.

Suppose that there is a low-resistive bridging defect between a node s1 in slave 108/110/TG4 and a supply terminal $V_{DD}$ (not shown) or a supply terminal $V_{ss}$ (not shown), causing a stuck-at 1 or a stuck-at 0 fault, respectively. At the positive transition of the clock, transmission gates TG1 and TG4 change from a conducting state to a blocking state, and transmission gates TG2 and TG3 change from a blocking state to a conducting state. Node m2 starts to drive node s1 which till this moment was driven by node Q through transmission gate TG4. The input to node m2 is determined by node m1. Node m1 itself is going through a transitory phase since transmission gate TG1 is turning-off and transmission gate TG2 is turning-on. Therefore, node m1 has a limited driving capability. In a defect-free case, positive feedback via a pair of back-to-back inverters allows flipflop 102 to ride through this transitory phase. Now, due to the bridging defect, node s1 is constantly driven to the $V_{DD}$ or $V_{ss}$ level, as the case may be. If there is a low-resistive bridging defect at node s1, the driving capability of the defect is much stronger than that of node m2. As a result, master 104/106/TG2 is over-written by the driving defect through transmission gate TG3. The operation is similar to the write operation carried out in an SRAM cell. In a steady-state condition no current flows and, accordingly, the defect is not detected by well known $I_{DDQ}$ test techniques. Similarly, there may be other bridging and gate-oxide defects in slave 108/110/TG4 that are not detected through $I_{DDQ}$ measurements. In order to run a sensible $I_{DDQ}$-test, additional circuitry for independent CLOCK and CLOCK-BAR control is required to render flipflop 102 transparent as explained in European patent application EP-A 0 633 530. The voltage detection of the defects mentioned above depends on circuit level parameters and observability requirements.

Figure 2:
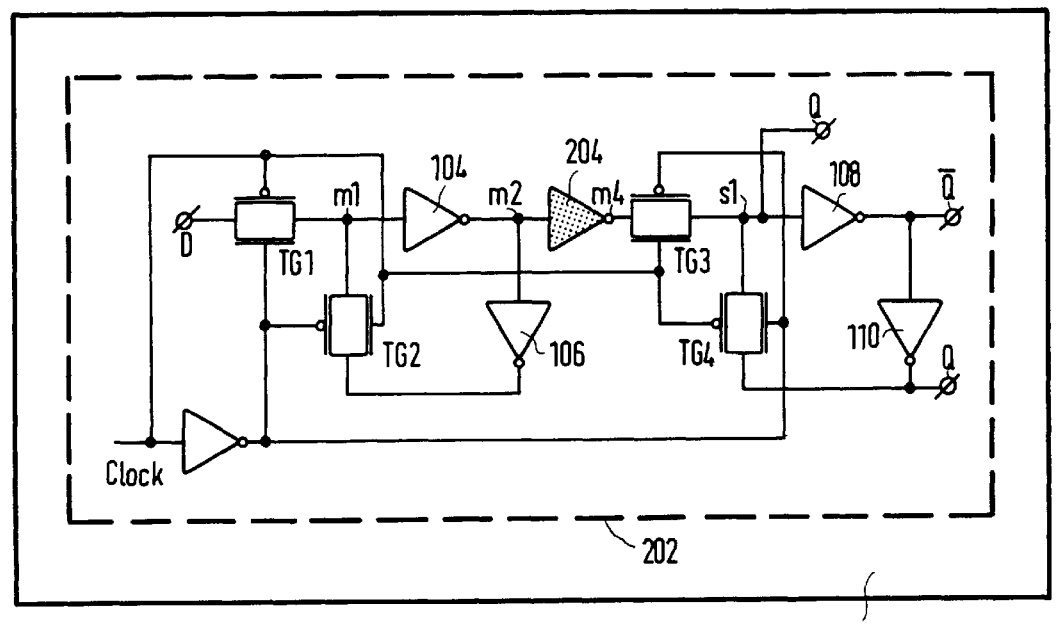
FIG. 2 is a diagram of a flipflop with unidirectional coupling.

FIG. 2 is a diagram of an electronic circuit 200 with a flipflop 202 that is suitable for $I_{DDQ}$-testing without requiring further circuitry to be added to the flipflop. Functionally, flipflop 202 corresponds to the Akata circuit mentioned above. Again, suppose that there is a bridging defect at node s1 as discussed with reference to FIG. 1. The bridging defects in slave 108/110/TG4 is $I_{DDQ}$-detectable if master 104/106/TG2 is prevented from being over-written by the defect. When master 104/106/TG2 is not over-written, the logical conflict is sustained. This can be achieved by making the coupling between master 104/106/TG2 and slave 108/110/TG4 unidirectional. Note that in flipflop 102 of FIG. 1 the coupling consists of transmission gate TG3 only, which is bi-directional. A unidirectional coupling between the master and slave is created by, for example, an additional inverter 204 between node m2 and transmission gate TG3, as shown in FIG. 2. Suppose that input D is kept at a logic low while the clock is also low. Node m4 is then low as well. Subsequently, the clock is switched to logic high. The change in the clock causes transmission gate TG3 to start conducting. As a result, a logical conflict is created between node m4, which is driven low by inverter 204 and node s1, which is driven high by the bridging defect. This conflict is sustained as long as the clock is logic high. During this clock state a quiescent current of detectable magnitude, in the order of mA, flows from the $V_{DD}$ supply terminal via node s1 into inverter 204 to $V_{ss}$.

Note that the polarities of output signals Q and QBAR in FIG. 2 have changed in comparison with that of the output signals in FIG. 1 when taken from the outputs of inverters 110 and 108, respectively. Output signal Q can be taken from node s1, i.e., between transmission gate TG3 and inverter 108.

Flipflop 202 has inverters 104 and 204 arranged in series in the signal path from input D to output Q (or Q-BAR). Since inverter 204 now provides the driving capability to control slave 108/110/TG4, inverter 104 represents a propagation delay but need not be present in the signal path. In order to handle delay-critical situations, the configuration of flipflop 202 is modified so that the propagation delay is substantially reduced.

Figure 3:
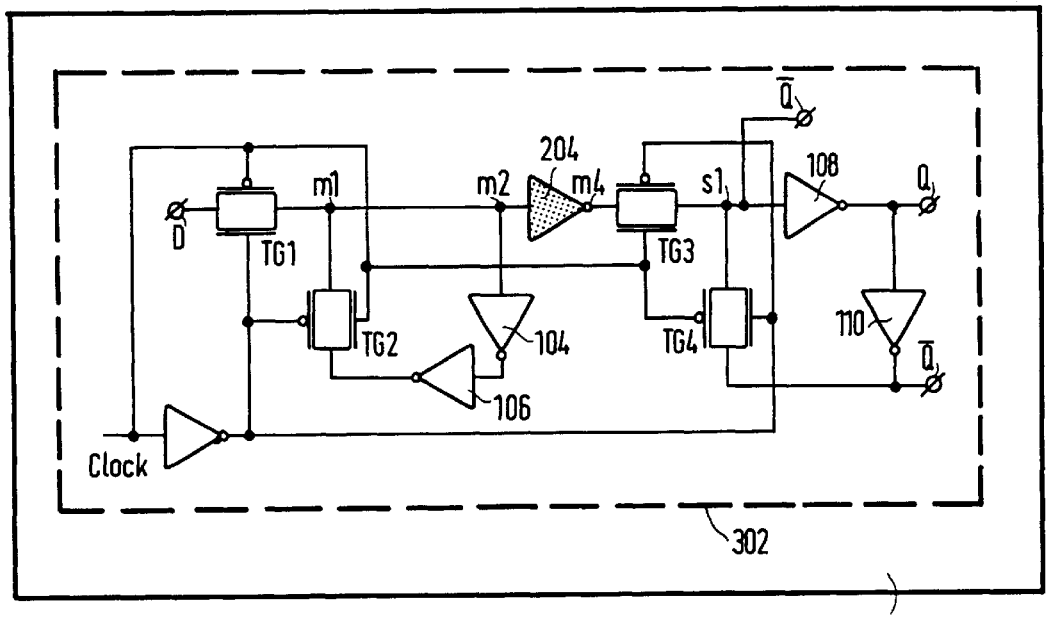
FIG. 3 is a diagram of a flipflop with unidirectional coupling and optimized signal path.

FIG. 3 is a diagram of a circuit 300 having a flipflop 302 with modified configuration. In master 104/106/TG2 inverters 104 and 106 now are both put into the feedback path between node m2 and node m1. Tests show that the propagation delay of flipflop 302 is reduced by about 30% relative to flipflop 202. The sum of set-up time and propagation delay of flipflop 302 is reduced by about 20% with respect to flipflop 202 and is about the same as for flipflop 102.

Figure 4:
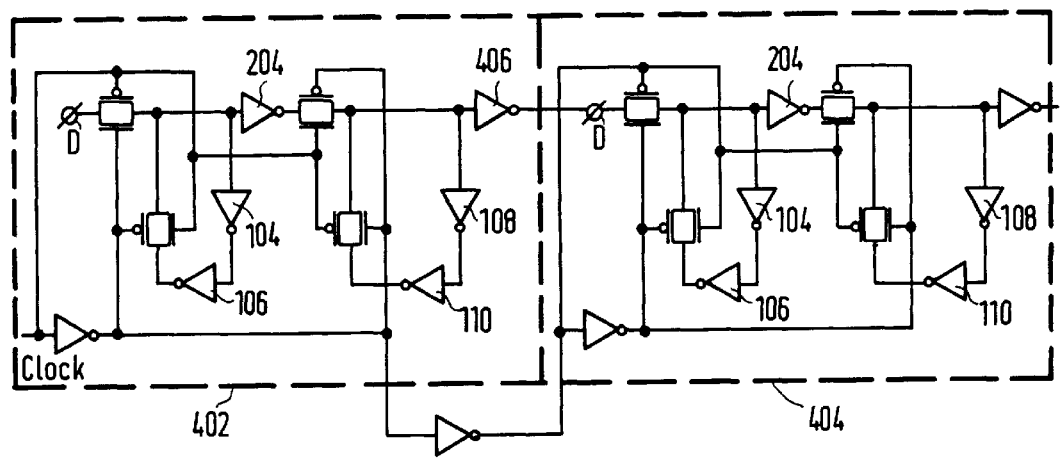
FIG. 4 is a diagram of a chain of flipflops.

FIG. 4 is a diagram of a circuit 400 with flipflops 402 and 404 in series. Flipflops 402 and 404 are extended versions of flipflop 302, in that inputs of inverters 406 and 408 are connected to an output of the slave of flipflops 402 and 404, respectively. Inverter 406 has an output connected to input D of flipflop 404. Note that both master and slave of flipflops 402 and 404 have the same configuration. For example, flipflop 402 has buffer 204 connected to the output of the master and buffer 406 connected to the output of the slave. In the coupling between the slave of flipflop 402 and the master of flipflop 404, buffer 406 plays the same role as does buffer 204 between the master and slave of the same flipflop 402. Accordingly, buffer 406 enables $I_{DDQ}$ detection of a stuck-at fault in the master of flipflop 404.

The gain-bandwidth product of a flipflop is a measure of how quickly the flipflop recovers from a metastable state. Various parameters (e.g., threshold voltages, transistor aspect ratios, substrate doping) can be optimized in order to improve the gain-bandwidth product of a flipflop. The gain-bandwidth product of a flipflop with constrained transistor sizes can be improved by reducing the RC times involved in charging and discharging the circuit's internal and external nodes. Therefore, the metastable behaviour of flipflop 302 is expected to be better than that of flipflop 202. Improvements in flipflop and latch metastability have been reported with the usage of clocked inverters instead of transmission gates. However, due to their larger transistor count and reduced maximum toggle rate such implementations are not popular with logic designers. Furthermore, the window between set-up and hold times can also be termed as the metastability window. The behaviour of a flipflop with respect to change of data in this window is not defined. Change of data in this window may therefore lead to metastability. The width of this window could be a figure of merit for a robust flipflop. As flipflops 202 and 302 have substantially shorter set-up and hold times than conventional flipflop 102, flipflops 202 and 302 have essentially smaller metastability windows compared to conventional flipflop 102. In summary, $I_{DDQ}$ testable flipflop 302 provides an excellent alternative to high performance flipflop configurations.

FIGS. 1 to 3 show circuits 100, 200 and 300 comprising at least one flipflop 102, 202 and 302, respectively. An integrated digital or hybrid circuit typically comprises several thousand flipflops. In order to not obscure the drawing only a single flipflop has been represented in full detail. Further, FIGS. 1–4 show inverters merely as functional representations. It is to be understood that other inverting logic gates such as NAND gates and NOR gates could be used instead.

What is claimed is:

1. A method of testing an electronic circuit that has at least one flipflop with a master and a slave, at least one of said master and slave having a bidirectional switchable coupling element in a signal path, said master and slave being interconnected via a controllable coupling, the method comprising quiescent current testing of the flipflop, characterized in that the method comprises:

providing a unidirectional coupling from said master to said slave; and applying the quiescent current testing to the flipflop, the quiescent current testing comprising:
determining the quiescent current after clock-controlled data transfer from the master to the slave.

2. An electronic circuit comprising a flipflop with a master and a slave interconnected via a controllable unidirectional coupling, wherein at least one of the master and the slave has a respective bi-directional switch in a signal path, and wherein the master comprises first and second inverters outside said signal path.

3. The circuit of claim 2, wherein the unidirectional coupling comprises a buffer.

4. The circuit of claim 2, wherein the slave comprises third and fourth inverters, an input of the third inverter being connected to the unidirectional coupling, and wherein the flipflop comprises an output buffer having an input connected to the input of the third inverter and to the unidirectional coupling.

5. The circuit of claim 2, wherein the slave comprises third and fourth inverters outside said signal path.

6. The electronic circuit as claimed in claim 2 wherein the master has a bidirectional switch in the signal path and the controllable unidirectional coupling comprises a buffer in series with a further bidirectional switch.

7. The electronic circuit as claimed in claim 6 wherein the slave comprises third and fourth inverters outside of said signal path.

8. The electronic circuit as claimed in claim 2 wherein the controllable unidirectional coupling comprises a switchable buffer.

9. An electronic circuit comprising a master-slave flipflop having a master latch and a slave latch each having a bi-directional switchable transmission gate in a signal path, means for enabling quiescent current testing of said flipflop and comprising a unidirectional coupling from said master latch to said slave latch, wherein the master latch includes first and second inverters serially connected and outside of said signal path, and the slave latch includes third and fourth serially connected inverters and outside of said signal path.

10. The electronic circuit as claimed in claim 9 wherein said unidirectional coupling comprises a buffer.

* * * * *